United States Patent [19]
Nunnally

[11] Patent Number: 5,761,181
[45] Date of Patent: Jun. 2, 1998

[54] HYPERSPEED ELECTRO-OPTICAL DIGITAL DATA STORAGE AND RETRIEVAL SYSTEM

[75] Inventor: William C. Nunnally, Columbia, Mo.

[73] Assignee: Board of Regents The University of Texas System, Austin, Tex.

[21] Appl. No.: 796,851

[22] Filed: Feb. 6, 1997

Related U.S. Application Data

[60] Provisional application No. 60/011,236 Feb. 6, 1996.

[51] Int. Cl.⁶ ............................ G11B 3/70; G11B 7/00
[52] U.S. Cl. ................ 369/126; 369/112; 369/272; 369/288
[58] Field of Search ............................ 369/126, 112, 369/280, 281, 288, 59, 272

[56] References Cited

PUBLICATIONS

Mukherjee, et al., "Very low loss channel waveguides in polymethylmethacrylate," *Appl. Phys. Lett.*, 65(25), pp. 3179–3181, 19 Dec. 1994.

*Primary Examiner*—Tod R. Swann
*Assistant Examiner*—Kim-Kwok Chu
*Attorney, Agent, or Firm*—Arnold, White & Durkee

[57] ABSTRACT

An electro-optical system is provided for the high speed storage and retrieval of digital information. In an exemplary embodiment, the system comprises pairs of closely coupled optical waveguides, with an intervening boundary storage layer. Data may be written to the storage layer during fabrication or by an external laser process. Data is read by injecting an input optical pulse which is lightly coupled through the storage layer to the data waveguide, where it may exit as an optical pulse train. This output may be converted to electrical signals.

32 Claims, 5 Drawing Sheets

HYPERSPEED ELECTRO-OPTICAL DIGITAL DATA STORAGE AND RETRIEVAL SYSTEM

This application claims the benefit of U.S. Provisional patent application Ser. No. 60/011,236 by William C. Nunnally, filed Feb. 6, 1996.

BACKGROUND OF THE INVENTION

The present invention relates to a high speed electro-optical digital data storage and retrieval system. FIGS. 1A and 1B illustrate the current standard compact disk—read only memory or CD-ROM system, which stores digital data as a series of data pits 2 and data landings 4 in a spiral track 3 on the surface of a disk 6. A laser read head 8 is held by a transverse frame 9 used to follow the spiral track 3 and to retrieve the digital data as the disk spins. The spiral track 3 comprises a series of data pits 2 and data landings 4. This data is read by laser read head 8, which includes a laser reading beam 5 surrounded by laser tracking beams 7. The approximate length of each data pit 2 and data landing 4 is about 1 micron.

The data can be removed only as fast as the disk surface moves past the laser detector head. Furthermore, the common CD-ROM must be removed and replaced when the user desires another program, game, or data set. The state-of-the-art data retrieval rate of commercially available CD-ROMs is approximately $10^6$ bits/sec and the storage density is approximately $10^6$ bits/mm$^2$ with a total CD capacity of approximately 7–8 GB per layer.

The IBM™ multi-layer system and the Sony™ double sided system can thus store several tens of gigabits of data, but are still hindered by the slow rate of data retrieval. It would therefore be desirable to develop a data storage and retrieval system with a larger storage capacity and faster retrieval rates.

SUMMARY OF THE INVENTION

The present invention is based on adjacent optical waveguides in which the digital data is stored in a waveguide interface that is common to a probe waveguide and a data waveguide. The adjacent data and probe waveguides can be parallel to each other or intersect at any angle. For the purposes of the initial discussion, the probe and data waveguides are parallel with a continual common interface. The common interface is modified with a laser during the writing process such that the coupling between the probe waveguide and the data waveguide is increased or decreased at specific spatial locations. Due to the spatial modification of the common interface layer at specific locations, the coupling between the probe waveguide and the data waveguide is altered such that an optical impulse traveling along the probe waveguide generates a change in the optical energy coupled into the optical data waveguide at each spatial location that travels both directions (only one direction desired) in the data waveguide. Digital data is stored along the common waveguide interface at regular intervals. Digital data is retrieved or read when a probe pulse is injected into the probe waveguide and couples a small amount of optical energy to the data waveguide at each modified interface location to generate a train of optical impulses in the data waveguide that corresponds to the stored data. The optical pulses may then be converted to electrical signals. Further, data stored in the waveguide interface may be erased, thereby creating a read/write system.

An exemplary embodiment of the present invention is an electro-optical memory comprising at least one coupled waveguide pair, each pair having a first optical waveguide adapted to receive an optical pulse and a second optical waveguide adapted to transmit an optical pulse; and a digital data storage waveguide interface disposed between the first optical waveguide and the second optical waveguide of each waveguide pair.

The present invention may also include an electro-optical memory, comprising a first layer having a plurality of optical waveguides adapted to receive optical pulses; a second layer having a plurality of optical waveguides adapted to transmit optical pulses; and a digital data storage layer disposed between the first layer and the second layer.

A memory according to the present invention may be fabricated by providing a substrate; depositing a first waveguide layer disposed on the substrate; patterning the first waveguide layer to define a plurality of first waveguides; depositing an interface layer on the first waveguide layer; depositing a second waveguide layer on the interface layer; and patterning the second waveguide layer to define a plurality of second waveguides.

The present invention also includes methods for writing data to the memory of the present invention by injecting an optical pulse into the first optical waveguide having an intensity sufficient to selectively modify regions of the digital data storage waveguide interface so that a portion of the optical pulse is coupled to the second optical waveguide. The present invention also includes methods for reading data from the memory of the present invention by injecting a probe pulse into the first optical waveguide such that a portion of the probe pulse is coupled to the second optical waveguide as the data pulse at regions corresponding to the modified regions; and converting the data pulse to an electrical signal corresponding to the digital data.

DETAILED DESCRIPTION

Figure 1A:
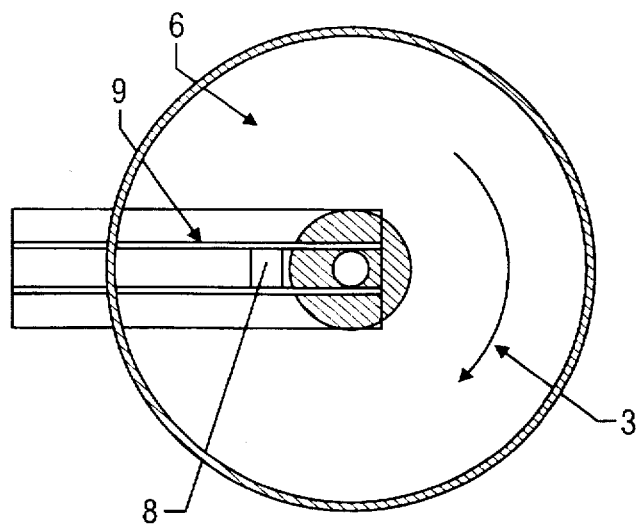
FIG. 1A is a schematic of a conventional CD-ROM data storage system.
Figure 1B:
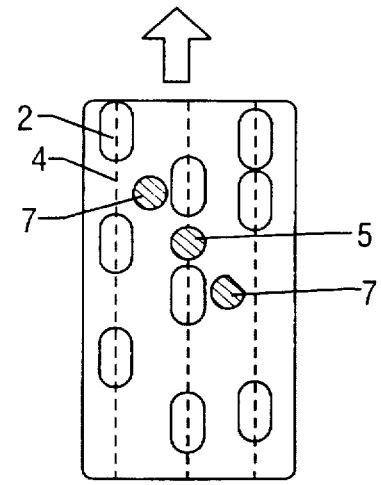
FIG. 1B is a close-up view of a laser track of a conventional CD-ROM system.
Figure 2:
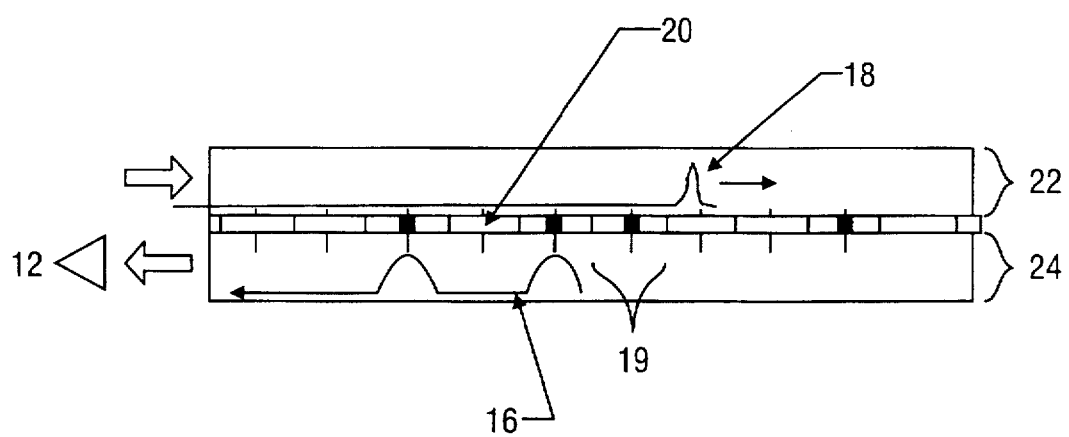
FIG. 2 is a side cross-sectional view of an optical waveguide data storage system in which the probe and data waveguides are co-linear and parallel according to the present invention.

The optical wave guide digital data storage system of the present invention as shown in FIG. 2, is known as an electro-optical memory (EOM). The invention is based on adjacent optical waveguides in which the digital data is stored in the waveguide interface 20 that is common to a probe waveguide 22 and a data waveguide 24. The common interface 20 is modified with a laser or other method of modifying the common boundary layer during the writing process such that the coupling between the probe waveguide 22 and the data waveguide 24 is increased or decreased at that spatial location. The coupling between the adjacent waveguides is modified such that an optical impulse 18 traveling along the probe waveguide 22 then produces a varying optical signal, which is lightly coupled into the data waveguide 24 to produce an optical data waveform 16 that travels both directions (only one direction desired) in the data waveguide 24. Digital data is stored along the common waveguide interface 20 at regular intervals by changing the properties of the boundary layer. Digital data is retrieved or read when a probe pulse 18 is injected into the probe waveguide 22 and couples optical energy to the data waveguide 24 at each modified interface location to generate a train of optical impulses 16 in the data waveguide 24 that corresponds to the stored data. As seen in FIG. 2, sections of the waveguide interface 20 are divided into a plurality of bit spaces 19. The bit spaces 19 that are darkened correspond to a coupling area having a logic value of "one". The bit spaces 19 that are clear correspond to an area of no coupling corresponding to a logic value of "zero".

FIG. 2 illustrates the operation of a parallel waveguide pair. The probe waveguide 22 is used to guide the probe optical pulse 18 moving from left to right. Digital data is stored in the common waveguide interface 20 by selectively modifying the common interface layer 20 to couple a small portion of the probe pulse 18 to the data waveguide 24, thereby generating an optical data pulse train 16 moving from left to right and right to left. The data pulse train is then converted to an electrical signal with the detector 12. The detectors 12 to be used in this scheme may be, for example, commonly available semiconductor diode detectors with high bandwidth. Further, it is desirable that the so detectors be wavelength matched to the laser source.

The material used for the storage interface layer 20 preferably has properties that change in response to optical intensity or wavelength or multi-photon coincidence or other forms of storage energy. The intensity and wavelength of the probe pulse 1 8 is designed to prevent modification of the boundary layer 20. Thus writing the digital data in the common boundary layer 20 between the probe waveguide 22 and data waveguide 24 requires an optical intensity greater than the probe pulse 18. The optical properties of the storage-boundary layer 20 must also be intensity or wavelength sensitive and capable of modification, either temporarily or long term, by the coincidence of a writing pulse and a data pulse to obtain sufficient density for modification or a writing laser beam, as will be discussed below. A number of materials have been investigated that change their index of refraction or conductivity due to optical energy, such as germano-silicate sol gel films, and giant magneto-resistance films as well as material similar to those used in electro-optical read write storage systems. The use of these and other materials for fabrication of the storage layer 20 is contemplated by this invention.

Figure 3:
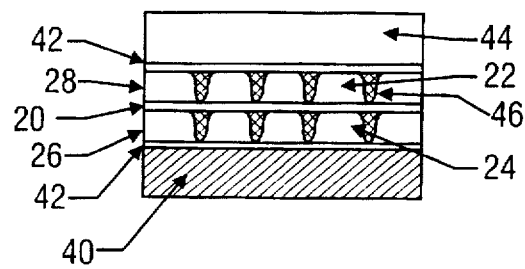
FIG. 3 is a cross-sectional view of closely coupled waveguide pairs with the probe and data waveguides on successive layers according to the present invention.

FIG. 3 shows a cross-section of an embodiment of a number of closely coupled waveguide pairs in a planar geometry according to the present invention. Fabricated on substrate 40 is a cladding layer 42, upon which waveguide layer 26 resides. Waveguide layer 26 includes data waveguides 24 and waveguide edges 46. Above waveguide layer 26 is the common interface storage layer 20, which stores the digital data. Above this layer is waveguide layer 28, which includes probe waveguides 22 and waveguide edges 46. Above this waveguide layer is a cladding-boundary layer 42 and an isolation-protection layer 44.

The waveguides may be, for example, multiple, planar, closely coupled, optical waveguide pairs (or triplets), which may be fabricated using subsequent depositions on planar surfaces. In between these waveguide pairs 22 and 24 is the common boundary layer 20, common to the probe waveguide above and the data waveguide below. Either single mode or multi-mode waveguides can be used in the present invention. In a preferred embodiment, single mode waveguides may be utilized, as they have the smallest cross-section dimensions and thus result in the largest data storage density, and are most beneficial in preserving short optical pulse lengths. In other embodiments of the present invention, one probe waveguide 22 can be closely coupled to several data waveguides 24. For example, the probe waveguide 22 may be placed in between two data waveguides 24, one on top and one on bottom.

Figure 4:
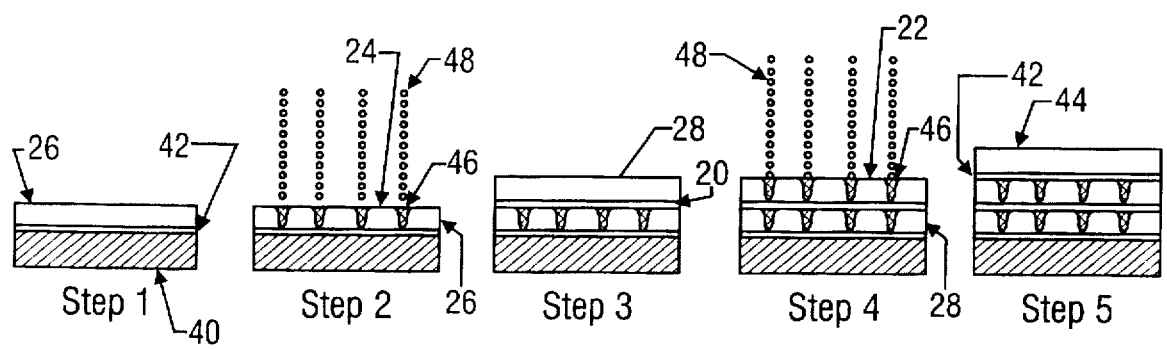
FIG. 4 illustrates the process steps for fabrication of planar coupled waveguide pairs in accordance with the present invention.

The waveguide system can be fabricated using standard deposition techniques which are well known in the art. For example, FIG. 4 shows exemplary process steps for fabricating the planar coupled waveguide pairs. Step 1 shows the deposition of boundary layer 42 and data waveguide layer 26 onto substrate 40. Step 2 shows the use of electron or ion beams 48 to pattern data waveguide edges 46. Step 3 shows the deposition of storage boundary layer 20 and probe waveguide layer 28. Step 4 shows the use of electron or ion beams 48 to pattern probe waveguide edges 46. Step 5 shows the deposition of boundary layer 42 and isolation-protection layer 44.

Substrate 40 may be made of, for example, a material with similar thermal expansion characteristics as the waveguide material. The waveguide layers may be deposited from a variety of materials including, for example, silicon dioxide ($SiO_2$), silicon nitride ($Si_3N_4$), or polymethylmethacrylate (PMMA). The waveguide edges 46 may be defined by changing the index of refraction of the waveguide material layer through implantation or by removing the waveguide core material through etching. In a PMMA layer, for example, the edges 46 can be defined using an ultra-violet wavelength laser. For example, A. Mukherjee et al in "Very low loss channel waveguides in polymethylmethacrylate", Appl. Phys. Lett., vol. 65 no. 25, p. 3179–3181, Dec. 19, 1994, disclose a method of fabricating waveguides from PMMA, the disclosure of which is hereby incorporated by reference. Electron or ion beams 48 may be used to change the index of refraction in the waveguide layer at the edge of the individual waveguides. Electron beam penetration depths are limited to about 1 micron. Therefore, ion beams or laser beams may be used if the dimensions are greater than 1–2 microns. It is noted that single mode waveguides will have a thickness or cross section on the order of 1–10 microns or dimensions of several times the optical wavelength, for commonly available injection laser diode wavelengths. Also, high density storage will tend toward the smaller dimensions such that electron beams may be appropriate in later embodiments.

Note that the probe waveguides 22 are aligned with the data waveguides 24 to form coupled waveguide pairs. The materials of the storage interface layer 20 are selected with properties that can be modified as a function of the intensity and/or the wavelength of the storage optical energy or other storage energy form. The boundary-storage layer 20 serves two purposes. First, it stores the digital data which may then be retrieved through the data waveguide 24. Second, as a boundary layer, it serves to contain the optical pulse traveling in both waveguides due to a difference in index of refraction when compared to the waveguide core.

The environmental layer 44 may be a mechanically rugged material, such as a plastic or glass. It is to be noted that the environmental layer 44 can serve as the boundary layer for the optical waveguides if the index of refraction is less than that of the core waveguide material.

Figure 5:
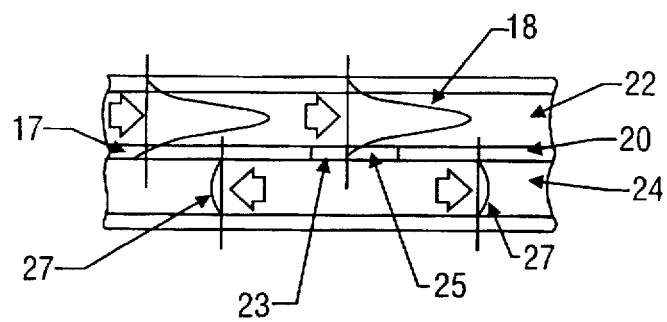
FIG. 5 is a side cross-sectional view of the optical waveguide structure illustrating coupling due to boundary layer property change.

FIG. 5 illustrates the structure of the coupled waveguide pair and the intensity profiles of the probe and data optical pulses. The high power optical probe pulse 18 propagates along the probe waveguide 22 in the direction indicated by the arrows with only a small amount of electric field in the boundary layer 20, which may be referred to as evanescent wave field 17, such that minimal energy is transferred to the data waveguide 24. At a region 23 of modified boundary layer 20, the evanescent wave field 17 is enhanced or altered as an enhanced wave field 25, such that the amount of the probe waveguide 22 optical energy coupled to the data waveguide 24 is altered at that location The small quanta of optical energy coupled to the data waveguide 24 then propagates in both directions as indicated by the arrows to the ends of the data waveguide 24 as a data pulse 27 having the data pulse intensity profile shown in FIG. 5, where it is detected Optical pulse 18 may be input from an injection probe. One embodiment of the injection probe may be an optical fiber that is mechanically moved to address the input of each coupled waveguide pair. For example, a mechanically movable read-write head may be used. Other embodiments of methods of selecting a specific coupled waveguide pair are directional switches of optical waveguides, controlled either by electric fields or other optical pulses, as demonstrated in optical computing research.

Figure 10:
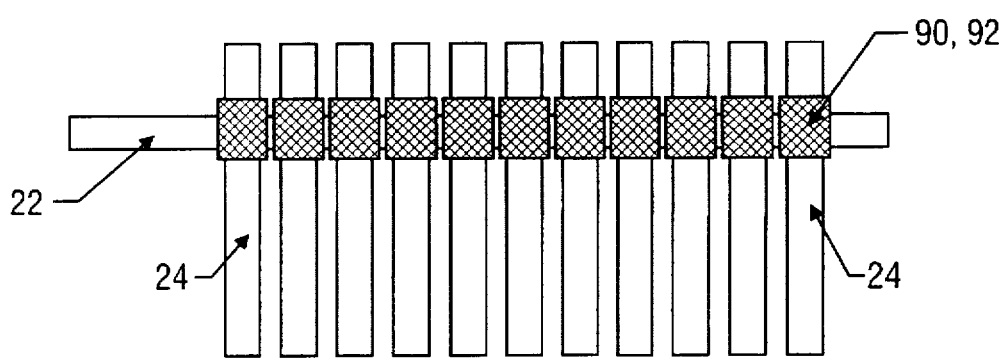
FIG. 10 is a schematic of field controlled, directional switches for selecting probe and data waveguides.

FIG. 10 shows, for example, using field controllable directional switches 90 to access all the probe and data waveguides on a single layer of coupled waveguide structures. As shown in FIG. 10, one layer of coupled waveguide pairs can be fabricated with only one input waveguide 22 and one output waveguide location 24 and the optical pulses directed by changing the field on the appropriate control electrodes 92.

Figure 6:
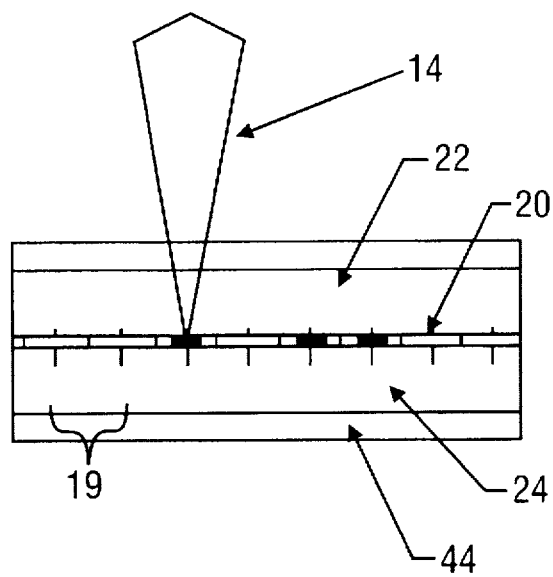
FIG. 6 illustrates one embodiment of a laser write process for the present invention.

FIG. 6 shows an exemplary embodiment of the laser write process for an embodiment of the present invention. The coupling from the probe waveguide 22 to the data waveguide 24 is altered along the common interface 20 using a laser 14, to write a digital "1" at selected regular intervals, as indicated by the darkened regions of common interface 20. The absence of interface coupling corresponds to a "0", as indicated by the clear regions of common interface 20. As shown in FIG. 6, the width of each bit 19 stored in common interface 20 may be approximately 5 microns, in an exemplary embodiment although other dimensions would also be acceptable. Additionally, in an exemplary embodiment, probe waveguide 22 and data waveguide 24 may be approximately 5 microns wide, and common interface 20 may be approximately 1 micron wide.

The common interface 20 modification can be accomplished in several ways, depending upon the material and the geometry of the modified area, including changing the index of refraction, the creation of a grating, etching or pitting metallic layer, or changing the polarization. In addition, if the common interface 20 is fabricated of a Giant Magneto-resistance layer, the transmittance of the interface layer can be radically changed.

The laser 14 to be used in this scheme is a common semiconductor laser with short temporal duration pulse and available short pulse power levels. Higher power levels are available using fiber amplifiers. If necessary, the temporal pulse width can be compressed using standard techniques to reduce the spatial dimension of the pulse. Note that a different pair of lasers can be used for writing with a wavelength different from the probe and data pulses if the properties of the storage layer are wavelength and/or intensity sensitive.

The time required to read the data in a waveguide is equal to 2 times the time required for the optical pulse to travel across the waveguide storage structure. For example, as illustrated in FIG. 6, if the bit spacing 19 is 5 microns, and the total waveguide length is 20 cm or 200 mm, the dielectric constant of the waveguide is 1.6, then total number of bits in one waveguide length is 10,000 bits. The time required to retrieve the data is 84 nanoseconds and the data retrieval rate is $10^{11}$ bits per second. This data rate is 5 orders of magnitude faster than the best CD-ROM system available. Admittedly, the time required for movement of the probe laser and detector to another waveguide pair will reduce the practical data retrieval rate, but with integrated electro-optical beam switching, the rate can approach the maximum rate of $10^{11}$ bits per second.

The corresponding data storage area density for the present invention, assuming the waveguide is 5 microns wide and 5 microns in length, is then $10^4$ bits/mm$^2$. Waveguides have been fabricated with single micron spacings. Single micron bit spacing and waveguide width result in a bit area density of $4 \times 10^5$ bits/mm$^2$. Shorter wavelength lasers should permit the present invention to achieve the same storage density as projected CD-ROM systems of approximately $10^6$ bits/mm$^2$.

Figure 7:
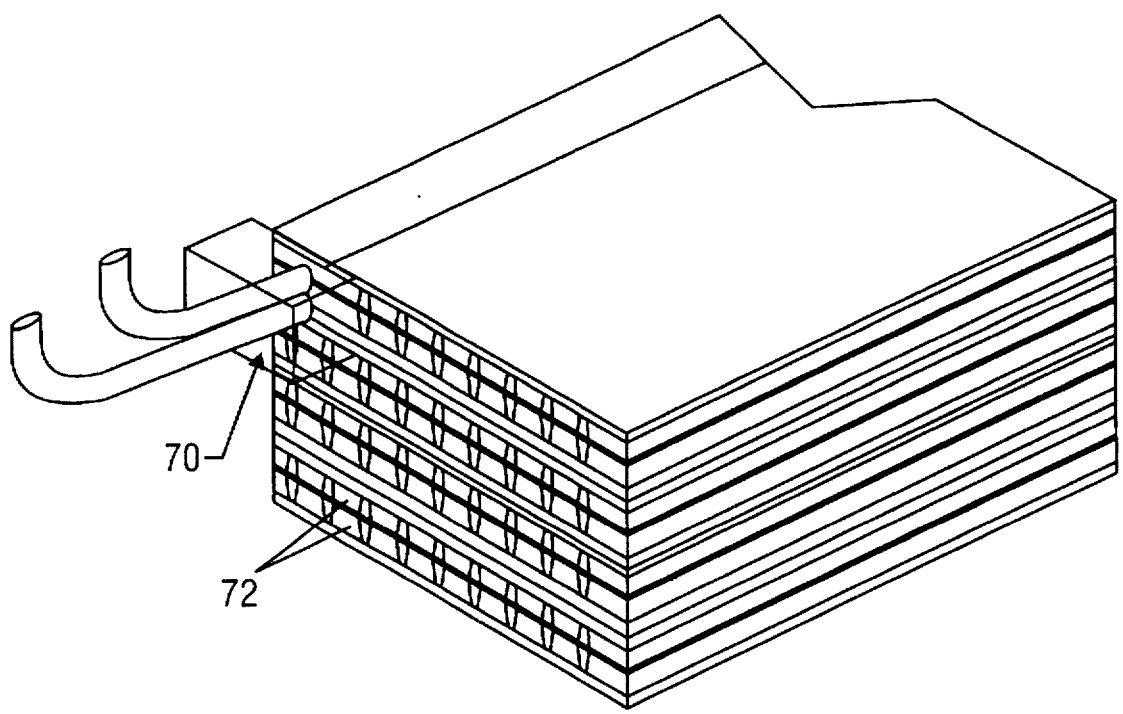
FIG. 7 is a cross-sectional view of a multi-layer coupled waveguide structure and data retrieval using optical fibers.

The area density of the present invention is comparable to that of CD-ROMs, but has the potential to greatly exceed the volumetric density of CD-ROMs, because multiple layers of coupled waveguides 72 can be fabricated as illustrated in FIG. 7. The multiple layers of coupled waveguides 72, each layer corresponding to a CD-ROM, can be accessed by an x-y moveable head 70, or in future systems by an integrated optical waveguide switching network. For example, a storage matrix of the present invention, similar to that illustrated in FIG. 7, the size of the common CD-ROM drive in a personal computer, 15 cm wide, 3.5 cm thick, and 20 cm deep, fabricated of coupled waveguide layers with a thickness of 100 microns, and an area data density of $10^5$ bits/mm$^2$ has a total data capacity of more than $10^{11}$ bits. As bit spacing is reduced to one micron and coupled waveguide layer thickness is reduced to 10 microns, the total data capacity approaches $10^{14}$ bits.

Figure 8:
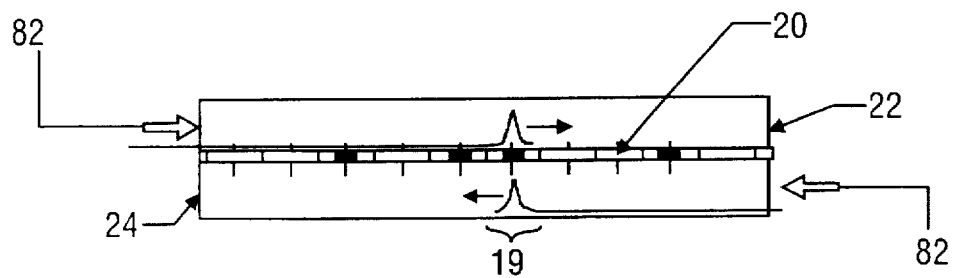
FIG. 8 illustrates the external write process for the present invention.
Figure 11:
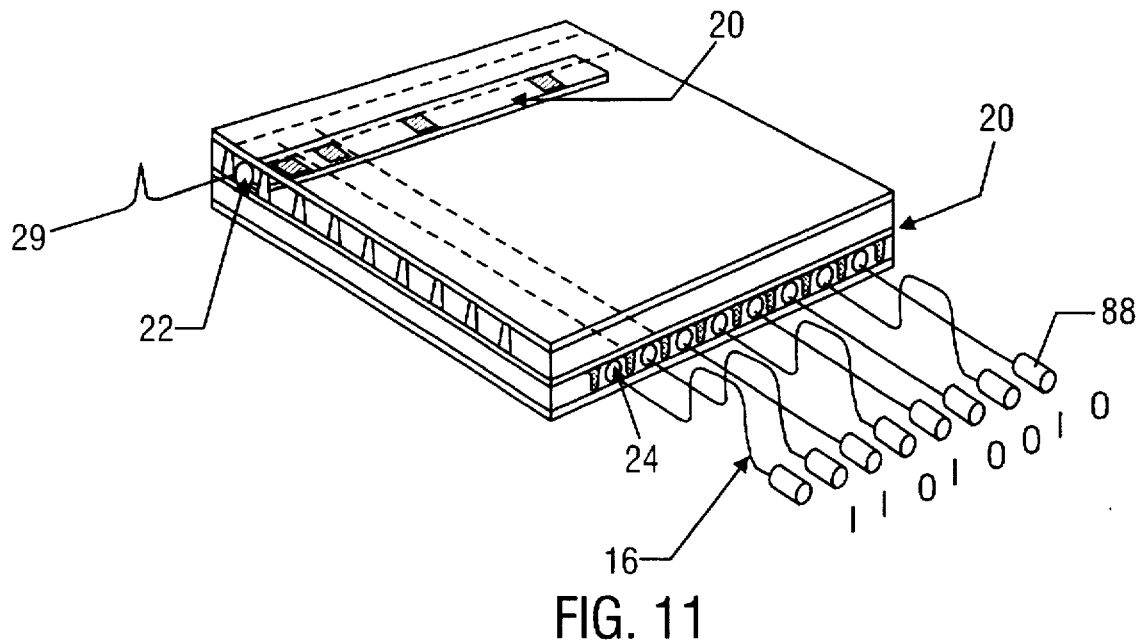
FIG. 11 illustrates one embodiment of a two-photon sensitive material as the common boundary layer interposed between parallel data waveguides and a probe waveguide.

The previous discussion has implied that each coupled waveguide layer must be laser written during fabrication. This mode of fabrication is practical for some applications such as read only memories or ROMs, but writing the data into the storage structure after layer fabrication is desired for fixed data and for read-write applications. External laser writing can, in principle, be accomplished as illustrated in FIG. 8. The electric field intensity at any location in the common interface layer 20 along the coupled waveguide structure can be controlled in a pulsed fashion by injecting short, high power optical pulses is 82 from opposite ends of the waveguide structure. The peak laser electric field in the common interface 20 occurs as the impulses pass and is used to modify the optical parameters of the data storage layer 20, in a manner similar to passive mode locking in a laser cavity with a saturable dye. Another example of storage medium is a multi-photon material in which the state of the material is changed by the coincidence of the evanescent tail of two optical pulses in the common boundary layer. This method of writing the digital information is most easily accomplished in the perpendicular embodiment in which a number of data waveguides 24 are perpendicular to the probe waveguides 22 as illustrated in FIG. 11. Other options include placing the data storage matrix in a magnetic field, electric field, or optical field to preferentially address and change the characteristics of any data location.

Further, it is contemplated that the present invention may provide a method to erase the data stored in data storage layer 20. Standard methods of erasing electro-optical media, as are known in the art, may be used. Thus, by providing the ability to erase stored data, the present invention provides a read/write system.

Figure 9:
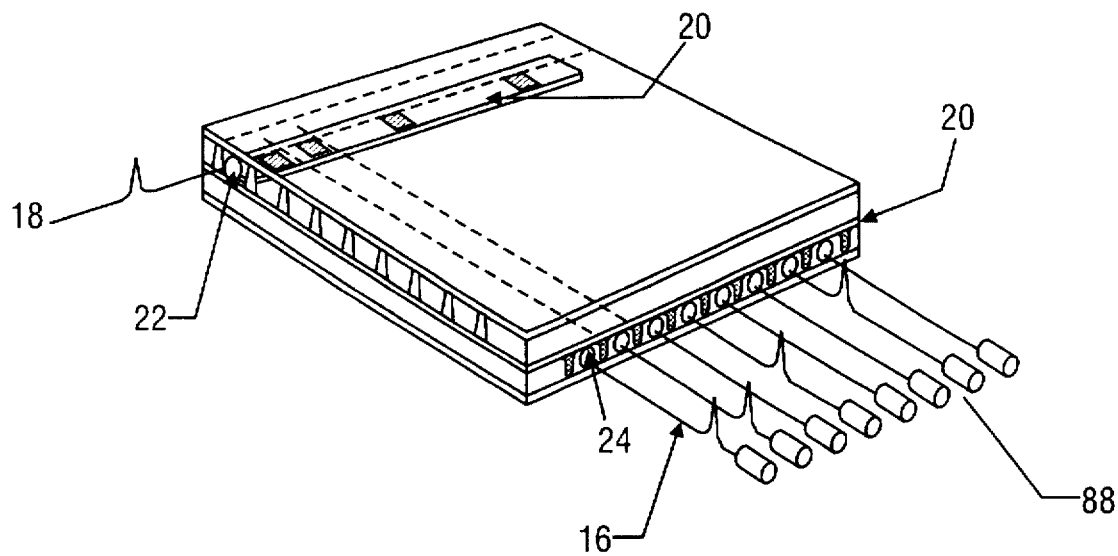
FIG. 9 illustrates parallel data waveguides which are perpendicular to the probe waveguide.

FIG. 9 shows an alternate configuration according to the present invention. This embodiment uses the same data storage and retrieval concept, in which the data waveguides 24 are perpendicular to the probe waveguides 22 to form a waveguide matrix. An input optical probe pulse 18 travels along probe waveguide 92. A small portion of the input pulse 18 is coupled through the interface layer 20 at modified locations to the perpendicular data waveguides 24, and the output data optical pulses 16 are detected with a parallel detector array 88. This configuration can be used to reduce the bandwidth of the detectors and data handling electronics and reduces the requirements on the temporal characteristics of the probe optical pulse.

The perpendicular matrix of probe and data waveguides illustrated in FIG. 9 may be used to enable several operations using this closely coupled waveguide structure. For example, a multi-photon sensitive material, such as a two-photon sensitive material, may be is used as the common boundary 20 between the data waveguides 24 and the probe waveguides 22 to write digital information in the EOM of the present invention.

In the perpendicular waveguide embodiment, probe waveguide "rows" and data waveguide "columns" form a waveguide matrix in which the probe waveguides 22 and the data waveguides 24 have a common boundary 20 at each intersection. In this embodiment, digital information may be stored rapidly by configuring an optical source array 88 that can inject optical pulses into each data waveguide, as shown in FIG. 11. Digital data is then stored in a probe waveguide "row" by energizing the data waveguide sources with optical pulses 16 of photon energy, $E_1$, in data waveguide "columns" in which a digital "1" is to be stored and injecting a perpendicular write set laser pulse 29, with photon energy $E_2$, in the probe waveguide row. The simultaneous combination of the photon energies, $E_1$ and $E_2$, in the common boundary 20 at the intersections of the probe waveguides 22 and data waveguides 24 then alters the material properties of the two-photon boundary material, whereas the energy from only one optical source, $E_1$ or $E_2$, is insufficient to change the material.

The waveguide matrix or perpendicular configuration may also be used to erase digital information stored in the two-photon material by illuminating all waveguides with both lasers, or by an optical source (not shown) having a different (third) wavelength, depending upon the material. In addition, a third laser (not shown) may be used as a probe pulse to further pump a storage location to a radiating level, thereby resulting in an optical output originating in each stored "1" location.

Figure 12:
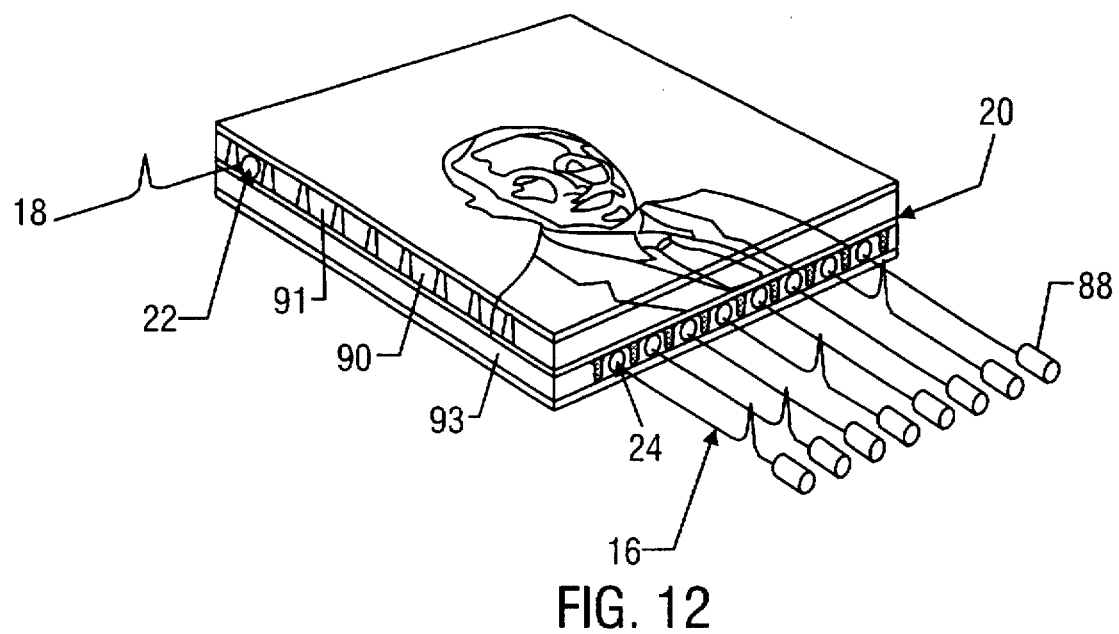
FIG. 12 illustrates an optically-sensitive film as a common boundary layer interposed between parallel data waveguides and a probe waveguide for rapid optical digitization.

The present invention may also be used to permit rapid optical image recording, as shown in FIG. 12. Optical image recording may be recorded by an optically-sensitive film that serves as a common waveguide boundary layer 90 between the probe waveguide layer 91 and the perpendicular data waveguide layer 93. The image to be recorded may be imaged on the optically-sensitive layer 90 through the data waveguide layer 93 or the probe waveguide layer 91. Once the image has been gated and the optically-sensitive layer properties altered, the state of the optically-sensitive layer 90 may be read by sequentially injecting an optical probe pulse 18 into each probe waveguide 22. The data stored in each perpendicular data waveguide 24 may therefore be recorded in the parallel detectors 88. This embodiment permits rapid readout and direct optical-to-electrical scene conversion with a resolution determined by the size of the image and the relative size of waveguide spacing.

Further modification and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having benefit of this description of the invention.

What is claimed is:

1. An electro-optical memory, comprising:

at least one coupled waveguide pair, each pair having a first optical waveguide adapted to receive an optical pulse and a second optical waveguide adapted to transmit an optical pulse; and a digital data storage waveguide interface disposed between said first optical waveguide and said second optical waveguide of each waveguide pair.

2. The electro-optical memory of claim 1, said first and second optical waveguides of each waveguide pair, comprising single mode waveguides.

3. The electro-optical memory of claim 1, comprising a plurality of coupled waveguide pairs and a plurality of waveguide interfaces disposed between each of said first optical waveguides and each of said second optical waveguides.

4. The electro-optical memory of claim 1, said first optical waveguide of each waveguide pair comprising a probe waveguide.

5. The electro-optical memory of claim 1, said second optical waveguide of each waveguide pair comprising a data waveguide.

6. An electro-optical memory, comprising: a first layer having a plurality of optical waveguides adapted to receive optical pulses;

a second layer having a plurality of optical waveguides adapted to transmit optical pulses; and a digital data storage layer disposed between said first layer and said second layer.

7. The electro-optical memory of claim 6, wherein said first layer is aligned with said second layer so that a plurality of coupled waveguide pairs are formed by coupling one of said optical waveguides of said first layer and one of said optical waveguides of said second layer.

8. The electro-optical memory of claim 6, further comprising a substrate to support said first layer.

9. The electro-optical memory of claim 8, further comprising a cladding layer disposed between said substrate and said first layer.

10. The electro-optical memory of claim 6, said plurality of optical waveguides within each of said layers being separated by waveguide edges.

11. The electro-optical memory of claim 6, further comprising a cladding-boundary layer disposed adjacent said second layer.

12. The electro-optical memory of claim 6, further comprising an isolation-protection layer disposed adjacent said second layer.

13. The electro-optical memory of claim 6, said first and second layers being selected from the group consisting of $SiO_2$, $Si_3N_4$, or PMMA.

14. The electro-optical memory of claim 6, said interface layer comprising a material having an index of refraction less than that of said first and second layers.

15. The electro-optical memory of claim 6, said interface layer comprising a material having optical properties that are modifiable in response to optical stimulation.

16. The electro-optical memory of claim 6, further comprising, an optical source selectively connected to inject a probe pulse into one of said plurality of optical waveguides of said first layer, and a detector selectively connected to receive a data pulse from one of said plurality of optical waveguides of said second layer.

17. The electro-optical memory of claim 16, said detector being selectively connected by arrays of field controllable directional switches.

18. The electro-optical memory of claim 16, said detector being selectively connected by a movable read-write head.

19. The electro-optical memory of claim 6, further comprising a plurality of first layers, a plurality of second layers, and a plurality of interface layers, each of said plurality of interface layers disposed between one of said plurality of first layers and one of said plurality of second layers.

20. The electro-optical memory of claim 6, said first layer being skewed relative to said second layer.

21. The electro-optical memory of claim 6, said interface layer comprising a multi-photon sensitive material.

22. The electro-optical memory of claim 6, said interface layer comprising an optically-sensitive film.

23. A method of fabricating an electro-optical memory, comprising:

providing a substrate;

depositing a first waveguide layer disposed on said substrate;

patterning said first waveguide layer to define a plurality of first waveguides;

depositing an interface layer on said first waveguide layer;

depositing a second waveguide layer on said interface layer; and patterning said second waveguide layer to define a plurality of second waveguides.

24. The method of claim 23, said patterning steps comprising projecting an electron or ion beam source onto said first and second waveguide layers.

25. The method of claim 23, further comprising depositing a boundary layer on said second waveguide layer.

26. The method of claim 23, further comprising depositing an isolation-protection layer on said boundary layer.

27. A method of writing digital data to an electro-optical memory including, a coupled waveguide pair having a first optical waveguide adapted to receive an optical pulse and a second optical waveguide adapted to transmit an optical pulse; and a digital data storage waveguide interface disposed between said first optical waveguide and said second optical waveguide, comprising:

injecting an optical pulse into said first optical waveguide having an intensity sufficient to selectively modify regions of said digital data storage waveguide interface so that a portion of said optical pulse is coupled to said second optical waveguide.

28. The method as claimed in claim 27, wherein said modified regions of said waveguide interface correspond to said digital data having a logic value of one.

29. A method of reading digital data from an electro-optical memory including, a coupled waveguide pair having a first optical waveguide adapted to receive a probe pulse and a second optical waveguide adapted to transmit a data pulse; and a waveguide interface having modified regions and unmodified regions, said waveguide interface being disposed between said first optical waveguide and said second optical waveguide, comprising the steps of:

injecting a probe pulse into said first optical waveguide such that a portion of said probe pulse is coupled to said second optical waveguide as said data pulse at regions corresponding to said modified regions; and converting said data pulse to an electrical signal corresponding to said digital data.

30. The method of claim 29, wherein said injecting step is performed by a laser source and said converting step is performed by a detector.

31. The method of claim 29, said modified regions of said waveguide interface corresponding to said digital data having a logic value of one.

32. The method of claim 29, wherein said probe pulse has an intensity insufficient to modify said waveguide interface.

* * * * *